United States Patent [19]

Osada et al.

[11] Patent Number: 5,708,959
[45] Date of Patent: *Jan. 13, 1998

[54] SUBSTRATE FOR SEMICONDUCTOR APPARATUS

[75] Inventors: Mituo Osada; Yoshinari Amano; Nobuo Ogasa; Akira Ohtsuka, all of Itami, Japan

[73] Assignee: Sumitomo Electric Industries, Ltd., Osaka, Japan

[*] Notice: The term of this patent shall not extend beyond the expiration date of Pat. No. 5,086,333.

[21] Appl. No.: 635,651

[22] Filed: Apr. 22, 1996

Related U.S. Application Data

[60] Continuation of Ser. No. 368,657, Jan. 4, 1995, Pat. No. 5,525,428, which is a division of Ser. No. 284,277, Aug. 2, 1994, Pat. No. 5,409,864, which is a continuation of Ser. No. 82,812, Jun. 28, 1993, abandoned, which is a continuation of Ser. No. 717,462, Jun. 17, 1991, abandoned, which is a division of Ser. No. 382,056, Jul. 13, 1989, Pat. No. 5,086,333, which is a continuation of Ser. No. 90,392, Aug. 27, 1987, abandoned, which is a continuation of Ser. No. 831,124, Feb. 21, 1986, abandoned, which is a continuation of Ser. No. 515,890, Jul. 21, 1983, abandoned.

[30] Foreign Application Priority Data

Jul. 26, 1982 [JP] Japan .................. 57-131026

[51] Int. Cl.$^6$ .................. B22F 3/26; B22F 7/04; H01L 23/373
[52] U.S. Cl. .................. 428/552; 428/546; 428/615; 437/902; 437/925; 257/706; 257/707; 257/713; 257/717; 257/720; 419/27
[58] Field of Search .................. 428/546, 552, 428/615; 437/948, 925, 902; 257/708, 720, 729, 706, 707, 713, 717; 419/27, 38

[56] References Cited

U.S. PATENT DOCUMENTS

| | | | |
|---|---|---|---|
| 1,552,184 | 9/1925 | Adams | 428/567 |
| 1,848,437 | 3/1932 | Sieger et al. | 428/568 |
| 1,860,793 | 5/1932 | Weiger | 428/553 |
| 2,179,960 | 11/1939 | Schwarzkopf | 75/22 |
| 2,763,822 | 9/1956 | Frola et al. | 317/234 |
| 2,971,251 | 2/1961 | Willemse | 29/195 |
| 3,097,329 | 7/1963 | Siemens | 317/234 |
| 3,204,158 | 8/1965 | Schreiner et al. | 357/67 |
| 3,353,931 | 11/1967 | Zdanuk et al. | 29/182.1 |
| 3,409,974 | 11/1968 | Lueck et al. | 29/420.5 |
| 3,423,203 | 1/1969 | Zdanuk et al. | 75/208 |
| 3,685,134 | 8/1972 | Blue | 29/420.5 |
| 3,969,754 | 7/1976 | Kuniya et al. | 357/65 |
| 4,025,997 | 5/1977 | Gernihs et al. | 428/621 |
| 4,158,719 | 6/1979 | Frantz | 428/567 |
| 4,196,442 | 4/1980 | Kuniya et al. | 357/67 |
| 4,340,090 | 7/1982 | Honda et al. | 357/74 |
| 4,427,993 | 1/1984 | Fichot et al. | 357/81 |
| 4,451,540 | 5/1984 | Baird et al. | 428/615 |
| 4,556,899 | 12/1985 | Kurihara et al. | 357/80 |
| 4,680,618 | 7/1987 | Kuroda et al. | 357/74 |
| 5,086,333 | 2/1992 | Osada et al. | 357/67 |
| 5,099,310 | 3/1992 | Osada et al. | 357/81 |
| 5,409,864 | 4/1995 | Osada et al. | 437/209 |
| 5,525,428 | 6/1996 | Osada et al. | 428/546 |

FOREIGN PATENT DOCUMENTS

| | | |
|---|---|---|
| 1 143 588 | 2/1963 | Germany . |
| 2 853 951 | 7/1980 | Germany . |
| B 49-2449 | 1/1974 | Japan . |
| 50-62776 | 5/1975 | Japan . |
| A 52-59572 | 5/1977 | Japan . |
| A 52-117075 | 10/1977 | Japan . |
| 56-030092 | 3/1981 | Japan . |
| 57-152438 | 9/1982 | Japan . |
| 58-067049 | 4/1983 | Japan . |
| 857569 | 12/1960 | United Kingdom . |
| 931820 | 7/1963 | United Kingdom . |

OTHER PUBLICATIONS

Smithells, *Tungsten: A Treatise on Its Metallurgy, Properties and Applications*, Third Edition, 1952, pp. 260–262.

Nikkan Kogyo, "Powder Metallurgy Application Product," *Powder Metallurgy Technical Course No. 8*, Jul. 1964, pp. 271.

"Codification of Ceramic Material Techniques," 1979, pp. 344–345.

Goetzel, *Treatise on Powder Metallurgy*, vol. II, 1950, pp. 203–205.

Moon et al., "Sintering of W-Cu Contact Materials with Ni and Co Dopants," *Powder Metallurgy International*, vol. 9, No. 1, 1977, pp. 23–24.

Dance et al., "Clad Metal Circuit Board Substrates for Direct Mounting of Ceramic Chip Carriers," *Electronic Packaging and Production*, Jan. 1982, pp. 228–237.

CMW Inc. Catalog, "Elkonite Series 200," Oct. 1979, pp. 201:1–201:4, 205:1–205:4, 210:1–210:2, 215:1–215:2, 220:1–220:2, 225:1, 230:1, 235:1–235:3, 240:1–240:2.

Hensel et al. "Physical Properties of Metal Compositions with a Refractory Metal Base," *Powder Metallurgy*, 1942, pp. 483–492.

Samsonov et al., "Activation of the Sintering of Tungsten by the Iron–Group Metals," *Soviet Powder Metallurgy And Metal Ceramics*, No. 10, Oct. 1969, pp. 804–808.

Agte et al., "Tungsten and Molybdenum," *NASA Technical Translation F–135*, 1963, pp. 118–119, 215, 260–267.

Acrian Inc. Catalog, "NPN Power Transistor," (Undated).

Meyer, "How to Select Electrical Contacts", *Metal Progress*, US, vol. 88, Jun. 1965–Dec. 1965, pp. 92–95.

(List continued on next page.)

*Primary Examiner*—Daniel J. Jenkins
*Attorney, Agent, or Firm*—Foley & Lardner

[57] ABSTRACT

This invention relates to a substrate for semiconductor apparatus loading a semiconductor chip in integrated circuit apparatus and is characterized in that a sintered compact containing copper of 2 to 30 wt. % in tungsten and/or molybdenum is used as the substrate having the heat radiation capable of efficiently radiating heat developed from the loaded semiconductor chip and thermal expansion coefficient similar to those of semiconductor chip and other enclosure material except for the substrate.

35 Claims, No Drawings

OTHER PUBLICATIONS

Yih and Wang, *Tungsten, Sources, Metallurgy, Properties and Applications*, New York and London, 1979, pp. 362–363.

Shinbun, *Powder Metallurgy and Sintered Materials*, Japan, 1964, pp. 264–267.

Benesovsky, *Powder Metallurgy and Sintered Materials*, Metallwerk Plansee AG & Co. KG, Germany, 1973, pp. 10–11, 146–156.

*ELMET Contact Materials*, Metallwerk Plansee AG & Co., Germany, 1977.

*Elkonite Data Book*, P. R. Mallory & Co., Indianapolis, Ind., 1941, pp. 1–30.

*Resistance Welding Data Book*, P. R. Mallory & Co., Indianapolis, Ind., 1951, pp. 308–309.

*Mallory Catalog*, P. R. Mallory & Co., Indianapolis, Ind., 1950, pp. 30–33.

*Mallory Product Guide*, P. R. Mallory & Co., Indianapolis, Ind., 1962, p. 22.

*Elkonite Refractory Metal Composites Catalog*, P. R. Mallory & Co., Indianapolis, Ind., 1962.

*Elkonite Refractory Metal Composites Catalog*, P. R. Mallory & Co., Indianapolis, Ind., 1968.

*Elkonite Catalog*, Contact Metals Welding Inc., Indianapolis, Ind. 1981, pp. 308–309.

*Thermkon Catalog*, Contact Metals Welding Inc., Indianapolis, Inc., 1982 (Copyright Registration Sep. 27, 1982).

Thermkon Trademark Registration No. 1,354,948, Aug. 20, 1985.

*Thermkon Catalog*, Contact Metals Welding Inc., Indianapolis, Ind., 1987.

German, *Liquid Phase Sintering*, NY and London, 1985, pp. 160–163.

Jones, *Fundamental Principles of Power Metallurgy*, London, 1960, pp. 504–509, 770–773.

Sands et al., *Powder Metallurgy Practice and Applications*, London, 1966, pp. 94–95.

Kosco, "New Low Expansion Alloys for Semiconductor Applications", *Solid State Technology*, Jan., 1969, pp. 47–49.

Hirschhorn, *Introduction to Powder Metallurgy*, NY, 1969, pp. 244–245.

Sebastian et al., "Liquid Phase Sintering", Metallurgy International, vol. 11, No.2, pp. 62–64, 1979.

Naidichi et al., "Densification in Liquid Phase Sintering Under Pressure in the System Tungsten–Copper", translated fro Porosbkovaya Metallurgiya, No. 1 (133) pp. 34–39, Jan. 1974.

Sebastian et al., "Densification in W–Cu Sintered Alloys Produced fro Coreduced Powders", Planseeberichte for Pulvemetallurgie, Bd. 25, No. 2, pp. 84–100, Jun. 1977.

SUBSTRATE FOR SEMICONDUCTOR APPARATUS

This application is a continuation of application Ser. No. 08/368,657, now U.S. Pat. No. 5,525,428 filed Jan. 4, 1995, which is a divisional of application Ser. No. 08/284,277, now U.S. Pat. No. 5,409,864 filed Aug. 2, 1994, which is a continuation of application Ser. No. 08/082,812, filed Jun. 28, 1993, now abandoned, which is a continuation of application Ser. No. 07/717,462, filed Jun. 17, 1991, now abandoned, which is a divisional of application Ser. No. 07/382,056, filed Jul. 13, 1989, now U.S. Pat. No. 5,086,333, which is a continuation of application Ser. No. 07/090,392, filed Aug. 27, 1987, now abandoned, which is a continuation of application Ser. No. 06/831,124, filed Feb. 21, 1986, now abandoned, which is a continuation of application Ser. No. 06/515,890, filed Jul. 21, 1983, now abandoned.

This invention relates to a substrate for mounting a semiconductor chip used in an integrated circuit or the like. An object of the invention is to provide a superior substrate for mounting the semi-conductor chip, which is capable of efficiently radiating heat developed from the mounted semiconductor chip and the substrate having a thermal expansion coefficient similar to those of semiconductor chip and material of other materials surrounding the same.

Substrates for mounting semi-conductor chips have conventionally been made of a Ni alloy consisting of Kovar (29% Ni—17% Co—Fe), 42 alloy; etc, or ceramics, such as alumina, forsterite, etc. The conventional substrates have thermal expansion coefficients similar to that of the semiconductor chip, and when high heat radiation is also required, various Cu alloys have been used.

However, recent remarkable progress in the semiconductor industry has promoted greater size of semiconductor chips or increased amounts of heat generation and the demand for a substrate material to meet both the characteristics of thermal expansion coefficient and heat radiation has been on the increase.

Under such conditions, tungsten, molybdenum, beryllia, etc., have been proposed as materials to meet both of the above characteristics.

Beryllia, however, in fact is not usable from the standpoint of environmental pollution. Although the thermal expansion coefficient of tungsten or beryllia corresponds well to that of the semiconductor chip, it has a large difference from that of alumina often used as the enclosure material and also from that of GaAs which has been used in increasing amounts for semiconductor chips. Furthermore tungsten and molybdenum are inferior to beryllia in heat radiation so as to be largely restricted in the packaging design.

The inventors, after conducting research on elimination of the above defects in materials for conventional substrates for mounting semiconductor chips to thereby control a thermal expansion coefficient and obtain a substrate material of good heat conductivity, have arrived at the present invention.

In other words, the semiconductor chip bearing substrate has a thermal expansion coefficient similar to those of semiconductor chips and enclosure materials, and is superior in heat conductivity. It comprises a sintered compact containing copper at 2 to 30% and tungsten and/or molybdenum.

When electrical insulation is required, the substrate is given a thin-layer surface coating of a ceramic or organic insulator, instead of conventional ceramic.

In this invention, there is employed Cu in the amount of 2 to 30 wt. % and W and/or Mo to obtain a thermal expansion coefficient of the substrate as similar as possible to those of Si and GaAs or sintered alumina or other enclosure materials, thereby reducing, to the extent possible, the influence of stress caused by the mismatch between the thermal expansion coefficients of the substrate and semiconductor chip and enclosure material. Hence, a proper amount of Cu need only be selected in the above range corresponding to the formation and size of the package.

This inventive substrate containing Cu and W and/or Mo is produced by powder metallurgy, because the manufacture of the same by the melting method is difficult due to the melting point and specific gravity difference between Cu, W and Mo. Among the powder metallurgy methods, sintering and infiltration are preferable.

Also, it is possible to make the W and/or Mo skeleton by adding thereto an iron group element at 20 wt. % or less.

A preferable amount of iron group element to be added is below 5 wt. %, but even above that, up to 20 wt. %, will form the skeleton.

The addition of an amount over 20 wt. %, however, is not preferred because the sintered compact produced is defective in the thermal characteristics and thus will not attain the objects of the invention.

The amount of iron group element, even when added to both W and Mo, can be added to W or Mo independently.

As seen from the above, the substrate of the invention can meet the increasing demand for large and high density semiconductor chip and be applicable as a substrate for the GaAs chip which is being put into practical use together with an Si chip.

Next, embodiments of the invention will be detailed as follows.

EXAMPLE 1

A powder mixture of tungsten and an iron group element were compacted in the size of 100×100×5 mm respectively, and sintered under an $H_2$ gas atmosphere at a temperature of 1000° to 1400° C., thereby obtaining an intermediate sintered compact with porosity of 1 to 50%. Cu was infiltrated into the sintered compact under the $H_2$ gas atmosphere at a temperature of 1200° C. to produce Cu—W alloy of Cu content of 1 to 40 wt. %.

The Cu—W alloy thus produced was measured for thermal expansion coefficient and thermal conductivity to obtain the results in Table 1.

In addition, the thermal expansion coefficients of $Al_2O_3$, Si, and GaAs were entered therein.

The marks * in Table 1 represent comparison examples outside the scope of the invention.

TABLE 1

| No. | Alloy Composition | Thermal Expansion Coefficient ($\times 10^{-6}$/°C.) | Thermal Conductivity (cal/cm.sec. °C.) |
|---|---|---|---|
| 1* | 1 Cu—99 W | 4.7 | 0.40 |
| 2 | 5 Cu—95 W | 5.2 | 0.45 |
| 3 | 10 Cu—10 W | 7.0 | 0.50 |
| 4 | 15 Cu—85 W | 7.9 | 0.54 |
| 5 | 20 Cu—80 W | 8.3 | 0.58 |
| 6 | 25 Cu—75 W | 9.0 | 0.62 |
| 7 | 30 Cu—70 W | 9.7 | 0.65. |
| 8* | 35 Cu—65 W | 11.0 | 0.69 |

TABLE 1-continued

| No. | Alloy Composition | Thermal Expansion Coefficient ($\times 10^{-6}$/°C.) | Thermal Conductivity (cal/cm.sec. °C.) |
|---|---|---|---|
| 9* | 40 Cu—60 W | 11.8 | 0.73 |
| 10 | 10 Cu—89 W—1 Ni | 7.0 | 0.48 |
| 11 | 20 Cu—79.5 W—0.5 Ni | 8.2 | 0.57 |
| 12 | 5 Cu—50 W—15 Fe | 7.9 | 0.42 |
| 13 | 10 Cu—79 W—11 Co | 8.1 | 0.46 |
| 14* | $Al_2O_3$ | 7.2 | |
| 15* | Si | 4.0 | |
| 16* | GaAs | 6.7 | |

In the above table, IC package using Cu—W alloy sintered compact (No. 3) of Cu content of 10 wt. % as the substrate material for mounting an Si chip produced no heat distortion due to a small difference between the thermal expansion coefficients of Si chip and other enclosure base materials of $Al_2O_3$ during the mounting process and an extremely good heat radiation and the device could produce an IC longer in life span and of high reliability.

EXAMPLE 2

A powder mixture of molybdenum and iron group element were compacted in the size of 100×100×5 mm respectively, and then were sintered under an $H_2$ gas atmosphere at a temperature of 1000° to 1400° C., thereby obtaining an intermediate sintered compact with a porosity of 1 to 50%.

Copper was infiltrated into the intermediate sintered compact under an $H_2$ gas atmosphere at a temperature of 1200° C., thereby producing a Cu—Mo alloy of copper content of 1 to 50 wt. %.

The Cu—Mo alloy thus produced was measured for the thermal expansion coefficient and heat conductivity, thereby having obtained the results in Table 2.

In addition, the marks * show comparison examples outside the scope of the invention.

TABLE 2

| No. | Alloy Composition | Thermal Expansion Coefficient ($\times 10^{-6}$/°C.) | Thermal Conductivity (cal/cm.sec. °C.) |
|---|---|---|---|
| 1* | 1 Cu—99 Mo | 5.3 | 0.35 |
| 2 | 5 Cu—95 Mo | 5.9 | 0.38 |
| 3 | 10 Cu—90 Mo | 6.5 | 0.41 |
| 4 | 15 Cu—85 Mo | 7.1 | 0.44 |
| 5 | 20 Cu—80 Mo | 7.9 | 0.48 |
| 6 | 25 Cu—75 Mo | 8.4 | 0.50 |
| 7 | 30 Cu—70 Mo | 9.1 | 0.54 |
| 8* | 35 Cu—65 Mo | 9.7 | 0.57 |
| 9* | 40 Cu—60 Mo | 10.3 | 0.60 |
| 10* | 50 Cu—50 Mo | 11.5 | 0.66 |
| 11 | 10 Cu—89.5 Mo—0.5 Ni | 6.5 | 0.39 |
| 12 | 15 Cu—82.0 Mo—3.0 Ni | 7.2 | 0.41 |
| 13 | 5 Cu—78 Mo—17 Fe | 8.2 | 0.36 |
| 14 | 10 Cu—82 Mo—8 Co | 7.8 | 0.40 |

In the above table 2, an IC package using a Cu—Mo alloy sintered compact (No. 4) as the substrate base material for mounting an Si chip produced no heat distortion at all due to a small difference between the thermal expansion coefficients of the Si chip and other enclosure base materials of $Al_2O_3$ during the mounting process and an extremely good heat radiation and the device could obtain an IC longer in life span and of high reliability.

EXAMPLE 3

Tungsten, molybdenum powder or tungsten—molybdenum alloy powder and the required amounts of copper powder and iron group powder were mixed as shown in Table 3, and the powder was mixed by an attrition mixer uniformly for three hours, compacted to the size of 30×30×5 mm under pressure of 1 t/cm², and then sintered under the $H_2$ gas atmosphere at a temperature of 1450° C. for one hour.

The alloy thus produced was measured for thermal expansion coefficient and heat conductivity, with the results set forth in Table 3. In addition, in Table 3, the marks * represent comparative examples outside the scope of the invention.

TABLE 3

| No. | Alloy Composition | Thermal Expansion Coefficient ($\times 10^{-6}$/°C.) | Thermal Conductivity (cal/cm.sec. °C.) |
|---|---|---|---|
| 1 | 15 Cu—85 W | 8.2 | 0.50 |
| 2 | 20 Cu—79 W—1 Ni | 8.5 | 0.48 |
| 3 | 20 Cu—75 W—5 Co | 8.7 | 0.47 |
| 4 | 30 Cu—68 W—2 Fe | 9.9 | 0.50 |
| 5 | 20 Cu—70 W—10 Mo | 8.5 | 0.54 |
| 6* | 35 Cu—65 W | 11.5 | 0.61 |

What is claimed is:

1. A semiconductor package for a semiconductor chip, comprising:
   (a) a first member consisting essentially of alumina and forming an enclosure material for said semiconductor package;
   (b) a second member made by a powder metallurgical method, wherein the powder metallurgical method comprises one of the steps of:
      (1) mixing only one of tungsten powder and molybdenum powder with copper powder, forming a mixed powder compact and sintering said mixed powder compact at a temperature higher than the melting point of copper, and
      (2) forming only one of tungsten powder and molybdenum powder into a powder compact, sintering said powder compact to form a sintered compact, and infiltrating said sintered compact with molten copper;

wherein said second member has a copper content within the range of 5–20 percent by weight.

2. A semiconductor package for a semiconductor chip as recited in claim 1, wherein said second member comprises 80–95 percent by weight of tungsten in the form of a sintered compact and 5–20 percent by weight of copper, and has a thermal conductivity of at least 0.45 cal/cm. sec. °C. and a thermal expansion coefficient between $5.2 \times 10^{-6}$/°C. and $8.3 \times 10^{-6}$/°C.

3. A semiconductor package for a semiconductor chip as recited in claim 1, wherein said second member comprises 80–95 percent by weight of molybdenum in the form of a sintered compact and 5–20 percent by weight of copper, and has a thermal conductivity of at least 0.38 cal/cm. sec. °C. and a thermal expansion coefficient between $5.9 \times 10^{-6}$/°C. and $7.9 \times 10^{-6}$/°C.

4. A package for a semiconductor chip comprising:
   (a) an alumina member enclosing said semiconductor chip; and
   (b) a heat radiation member comprising 80–90 percent by weight of preselected material selected from the group consisting essentially of only one of tungsten and molybdenum in the form of a sintered compact, and 10–20 percent by weight of copper, said heat radiation member being made by forming only one of tungsten powder and molybdenum powder into a powder compact, sintering said powder compact to form a sintered compact, and infiltrating said sintered compact with molten copper.

5. A package for a semiconductor chip as recited in claim 4, wherein the heat radiation member comprises 80–90 percent by weight of tungsten in the form of a sintered compact and 10–20 percent by weight of copper, and has a thermal conductivity of at least 0.50 cal/cm. sec. °C. and a thermal expansion coefficient between $7.0 \times 10^{-6}$/°C. and $8.3 \times 10^{-6}$/°C.

6. A package for a semiconductor chip as recited in claim 4, wherein the heat radiation member comprises 80–90 percent by weight of molybdenum in the form of a sintered compact and 10–20 percent by weight of copper, and has a thermal conductivity of at least 0.41 cal/cm. sec. °C. and a thermal expansion coefficient between $6.5 \times 10^{-6}$/°C. and $7.9 \times 10^{-6}$/°C.

7. A package for a semiconductor chip, said package made by the process of:
  (a) providing a first member consisting essentially of alumina;
  (b) producing a second member by a powder metallurgical method, wherein the powder metallurgical method comprises one of the steps of:
    (1) mixing only one of tungsten powder and molybdenum powder with copper powder, forming a mixed powder compact and sintering said mixed powder compact at a temperature higher than the melting point of copper, and
    (2) forming only one of tungsten powder and molybdenum powder into a powder compact, sintering said powder compact to form a sintered compact, and infiltrating said sintered compact with molten copper;
  (c) selecting a copper content within the range of 5–20 percent by weight; and
  (d) packaging said integrated circuit with said first and second members.

8. A package for a semiconductor chip as recited in claim 7, wherein said second member comprises 80–95 percent by weight of tungsten in the form of a sintered compact and 5–20 percent by weight of copper, and has a thermal conductivity of at least 0.45 cal/cm. sec. °C. and a thermal expansion coefficient between $5.2 \times 10^{-6}$/°C. and $8.3 \times 10^{-6}$/°C.

9. A package for a semiconductor chip as recited in claim 7, wherein said second member comprises 80–95 percent by weight of molybdenum in the form of a sintered compact and 5–20 percent by weight of copper, and has a thermal conductivity of at least 0.38 cal/cm. sec. °C. and a thermal expansion coefficient between $5.9 \times 10^{-6}$/°C. and $7.9 \times 10^{-6}$/°C.

10. A package for a semiconductor device, said package comprising a first member comprising alumina and a second member of composite material comprising by weight of about 5 to 30% of copper portion and from 95 to 70% of a preselected material selected from the group consisting essentially of only one of tungsten and molybdenum in the form of a porous block, said porous block having been impregnated with said copper portion from the molten state of said copper.

11. A package for a semiconductor device as recited in claim 10, wherein said second member comprises 70–95 percent by weight of tungsten in the form of a sintered compact and 5–30 percent by weight of copper, and has a thermal conductivity of at least 0.45 cal/cm. sec. °C. and a thermal expansion coefficient between $5.2 \times 10^{-6}$/°C. and $9.7 \times 10^{-6}$/°C.

12. A package for a semiconductor device as recited in claim 10, wherein said second member comprises 70–95 percent by weight of molybdenum in the form of a sintered compact and 5–30 percent by weight of copper, and has a thermal conductivity of at least 0.38 cal/cm. sec. °C. and a thermal expansion coefficient between $5.9 \times 10^{-6}$/°C. and $8.4 \times 10^{-6}$/°C.

13. A package for a semiconductor device as recited in claim 10, wherein said second member comprises 80–90 percent by weight of tungsten in the form of a sintered compact and 10–20 percent by weight of copper, and has a thermal conductivity of at least 0.50 cal/cm. sec. °C. and a thermal expansion coefficient between $7.0 \times 10^{-6}$/°C. and $8.3 \times 10^{-6}$/°C.

14. A package for a semiconductor device as recited in claim 10, wherein said second member comprises 80–90 percent by weight of molybdenum in the form of a sintered compact and 10–20 percent by weight of copper, and has a thermal conductivity of at least 0.41 cal/cm. sec. °C. and a thermal expansion coefficient between $6.5 \times 10^{-6}$/°C. and $7.9 \times 10^{-6}$/°C.

15. A package for a semiconductor chip comprising:
  (a) an alumina member enclosing said semiconductor chip; and
  (b) a heat radiation member comprising 70–95 percent by weight of preselected material selected from the group consisting essentially of only one of tungsten and molybdenum in the form of a sintered compact, and 5–30 percent by weight of copper.

16. A package for a semiconductor chip as recited in claim 15, wherein the heat radiation member comprises 70–95 percent by weight of tungsten in the form of a sintered compact and 5–30 percent by weight of copper, and has a thermal conductivity of at least 0.45 cal/cm. sec. °C. and a thermal expansion coefficient between $5.2 \times 10^{-6}$/°C. and $9.7 \times 10^{-6}$/°C.

17. A package for a semiconductor chip as recited in claim 15, wherein the heat radiation member comprises 70–95 percent by weight of molybdenum in the form of a sintered compact and 5–30 percent by weight of copper, and has a thermal conductivity of at least 0.38 cal/cm. sec. °C. and a thermal expansion coefficient between $5.9 \times 10^{-6}$/°C. and $8.4 \times 10^{-6}$/°C.

18. A package for a semiconductor chip as recited in claim 15, wherein the heat radiation member comprises 80–95 percent by weight of tungsten in the form of a sintered compact and 5–20 percent by weight of copper, and has a thermal conductivity of at least 0.45 cal/cm. sec. °C. and a thermal expansion coefficient between $5.2 \times 10^{-6}$/°C. and $8.3 \times 10^{-6}$/°C.

19. A package for a semiconductor chip as recited in claim 15, wherein the heat radiation member comprises 80–95 percent by weight of molybdenum in the form of a sintered compact and 5–20 percent by weight of copper, and has a thermal conductivity of at least 0.38 cal/cm. sec. °C. and a thermal expansion coefficient between $5.9 \times 10^{-6}$/°C. and $7.9 \times 10^{-6}$/°C.

20. A package for a semiconductor chip comprising:
  (a) a first member consisting essentially of alumina and enclosing said semiconductor chip; and
  (b) a second member comprising 80–95 percent by weight of preselected material selected from the group consisting essentially of only one of tungsten and molybdenum in the form of a sintered compact, and a copper content of 5–20 percent by weight.

21. A package for a semiconductor chip as recited in claim 20, wherein said second member comprises 80–95 percent by weight of tungsten in the form of a sintered compact and 5–20 percent by weight of copper, and has a thermal conductivity of at least 0.45 cal/cm. sec. °C. and a thermal expansion coefficient between $5.2 \times 10^{-6}$/°C. and $8.3 \times 10^{-6}$/°C.

22. A package for a semiconductor chip as recited in claim 20, wherein said second member comprises 80–95 percent by weight of molybdenum in the form of a sintered compact and 5–20 percent by weight of copper, and has a thermal conductivity of at least 0.38 cal/cm. sec. °C. and a thermal expansion coefficient between $5.9 \times 10^{-6}$/°C. and $7.9 \times 10^{-6}$/°C.

23. A package for a semiconductor device, said package comprising a first member consisting essentially of alumina and a second member of composite material comprising by weight of about 5 to 30% of copper portion and from 95 to 70% of a preselected material selected from the group consisting essentially of only one of tungsten and molybdenum in the form of a porous block, said porous block having been impregnated with said copper portion from the molten state of said copper.

24. A package for a semiconductor device as recited in claim 23, wherein said second member comprises 70–95 percent by weight of tungsten in the form of a sintered compact and 5–30 percent by weight of copper, and has a thermal conductivity of at least 0.45 cal/cm. sec. °C. and a thermal expansion coefficient between $5.2 \times 10^{-6}$/°C. and $9.7 \times 10^{-6}$/°C.

25. A package for a semiconductor device as recited in claim 23, wherein said second member comprises 70–95 percent by weight of molybdenum in the form of a sintered compact and 5–30 percent by weight of copper, and has a thermal conductivity of at least 0.38 cal/cm. sec. °C. and a thermal expansion coefficient between $5.9 \times 10^{-6}$/°C. and $8.4 \times 10^{-6}$/°C.

26. A package for a semiconductor device as recited in claim 23, wherein said second member comprises 80–90 percent by weight of tungsten in the form of a sintered compact and 10–20 percent by weight of copper, and has a thermal conductivity of at least 0.50 cal/cm. sec. °C. and a thermal expansion coefficient between $7.0 \times 10^{-6}$/°C. and $8.3 \times 10^{-6}$/°C.

27. A package for a semiconductor device as recited in claim 23, wherein said second member comprises 80–90 percent by weight of molybdenum in the form of a sintered compact and 10–20 percent by weight of copper, and has a thermal conductivity of at least 0.41 cal/cm. sec. °C. and a thermal expansion coefficient between $6.5 \times 10^{-6}$/°C. and $7.9 \times 10^{-6}$/°C.

28. A package for a semiconductor chip comprising:
(a) an alumina member enclosing said semiconductor chip; and
(b) a heat dissipation member comprising 80–90 percent by weight of preselected material selected from the group consisting essentially of only one of tungsten and molybdenum in the form of a sintered compact, and 10–20 percent by weight of copper, said heat dissipation member being made by forming tungsten powder, molybdenum powder, or a mixture thereof into a powder compact, sintering said powder compact to form a sintered compact, and infiltrating said sintered compact with molten copper.

29. A package for a semiconductor chip as recited in claim 28, wherein the heat dissipation member comprises 80–90 percent by weight of tungsten in the form of a sintered compact and 10–20 percent by weight of copper, and has a thermal conductivity of at least 0.50 cal/cm. sec. °C. and a thermal expansion coefficient between $7.0 \times 10^{-6}$/°C. and $8.3 \times 10^{-6}$/°C.

30. A package for a semiconductor chip as recited in claim 28, wherein the heat dissipation member comprises 80–90 percent by weight of molybdenum in the form of a sintered compact and 10–20 percent by weight of copper, and has a thermal conductivity of at least 0.41 cal/cm. sec. °C. and a thermal expansion coefficient between $6.5 \times 10^{-6}$/°C. and $7.9 \times 10^{-6}$/°C.

31. A package for a semiconductor chip comprising:
(a) an alumina member enclosing said semiconductor chip; and
(b) a heat dissipation member comprising 70–95 percent by weight of preselected material selected from the group consisting essentially of only one of tungsten and molybdenum in the form of a sintered compact, and 5–30 percent by weight of copper.

32. A package for a semiconductor chip as recited in claim 31, wherein the heat dissipation member comprises 70–95 percent by weight of tungsten in the form of a sintered compact and 5–30 percent by weight of copper, and has a thermal conductivity of at least 0.45 cal/cm. sec. °C. and a thermal expansion coefficient between $5.2 \times 10^{-6}$/°C. and $9.7 \times 10^{-6}$/°C.

33. A package for a semiconductor chip as recited in claim 31, wherein the heat dissipation member comprises 70–95 percent by weight of molybdenum in the form of a sintered compact and 5–30 percent by weight of copper, and has a thermal conductivity of at least 0.38 cal/cm. sec. °C. and a thermal expansion coefficient between $5.9 \times 10^{-6}$/°C. and $8.4 \times 10^{-6}$/°C.

34. A package for a semiconductor chip as recited in claim 31, wherein the heat dissipation member comprises 80–95 percent by weight of tungsten in the form of a sintered compact and 5–20 percent by weight of copper, and has a thermal conductivity of at least 0.45 cal/cm. sec. °C. and a thermal expansion coefficient between $5.2 \times 10^{-6}$/°C. and $8.3 \times 10^{-6}$/°C.

35. A package for a semiconductor chip as recited in claim 31, wherein the heat dissipation member comprises 80–95 percent by weight of molybdenum in the form of a sintered compact and 5–20 percent by weight of copper, and has a thermal conductivity of at least 0.38 cal/cm. sec. °C. and a thermal expansion coefficient between $5.9 \times 10^{-6}$/°C. and $7.9 \times 10^{-6}$/°C.

* * * * *